United States Patent
Tung et al.

(10) Patent No.: US 11,956,925 B2
(45) Date of Patent: Apr. 9, 2024

(54) COOLING SYSTEM OF SERVER

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 555 days.

(21) Appl. No.: 17/335,064

(22) Filed: May 31, 2021

(65) Prior Publication Data
US 2022/0159876 A1 May 19, 2022

(30) Foreign Application Priority Data
Nov. 16, 2020 (CN) .......................... 202011278677.3

(51) Int. Cl.
*H05K 7/20* (2006.01)

(52) U.S. Cl.
CPC ......... *H05K 7/20381* (2013.01); *H05K 7/203* (2013.01); *H05K 7/20318* (2013.01)

(58) Field of Classification Search
None
See application file for complete search history.

(56) References Cited

U.S. PATENT DOCUMENTS

| | | | |
|---|---|---|---|
| 5,504,924 A * | 4/1996 | Ohashi ................... | H05K 7/208 361/676 |
| 2008/0160363 A1* | 7/2008 | Tsukada ............ | H01M 8/04141 429/513 |
| 2019/0077591 A1* | 3/2019 | Inada ..................... | B65D 90/44 |

FOREIGN PATENT DOCUMENTS

| | | | | |
|---|---|---|---|---|
| CN | 107885294 A | * | 4/2018 | ......... H05K 7/20309 |
| JP | 1995218048 | * | 8/1995 | ............. F25B 43/00 |

* cited by examiner

*Primary Examiner* — Tuan S Nguyen
(74) *Attorney, Agent, or Firm* — CKC & Partners Co., LLC

(57) ABSTRACT

A cooling system of server includes a tank and a pressure control device. The tank is configured to accommodate a dielectric fluid. The pressure control device is configured to regulate the pressure of the tank. The pressure control device includes a condenser, a dehumidifier, a gas storage chamber, and a valve. The condenser is connected to the tank. The dehumidifier is connected to the condenser. The gas storage chamber is connected to the dehumidifier. The valve is connected between the dehumidifier and the gas storage chamber. The valve is configured to communicate and not to communicate the dehumidifier and the gas storage chamber.

5 Claims, 1 Drawing Sheet

COOLING SYSTEM OF SERVER

CROSS-REFERENCE TO RELATED APPLICATION

This application claims priority to China Application Serial Number 202011278677.3, filed Nov. 16, 2020, which is herein incorporated by reference in its entirety.

BACKGROUND

Field of Invention

The present disclosure relates to a cooling system of a server. More particularly, the present disclosure relates to a two-phase immersion cooling system.

Description of Related Art

Because of its better heat dissipation efficiency, the immersion cooling system is widely used in the heat dissipation of electronic components that generate a large amount of waste heat due to operation. A common implementation is such as immersing the server in the dielectric fluid in the liquid tank to achieve the purpose of heat dissipation. However, the water vapor in the air in the immersion cooling system will condense to form condensed water and return to the liquid tank and contact the electronic components immersed in the dielectric fluid, which may cause the risk of damage to the electronic components.

In order to prevent the condensed water formed by the condensation of water vapor in the air from contacting the electronic components and causing damage to the electronic components, a multi-hole case body containing molecular sieve (dehumidifying material) is currently installed in the liquid tank. The molecular sieve in the multi-hole case body can absorb the liquid water condensed in the liquid tank.

However, this multi-hole case body can only absorb water vapor or liquid water in contact with it. For a two-phase immersion cooling system without active liquid flow, it is not easy to control the contact between liquid water and molecular sieve, and it may occur that the cooling system is installed with molecular sieves but there is still liquid water on the surface of the dielectric fluid, which is not effective in removing water. In addition, because the multi-hole case body is placed in the liquid tank, it will enlarge the size of the liquid tank. There is also a dielectric fluid between the particles of the molecular sieve, which increases the usage of the dielectric fluid, which leads to an increase in the cost of the dielectric fluid and a decrease in the system density. In current pressure control devices, the system will exhaust or absorb gas due to pressure changes. In this case, whenever the cooling system draws in fresh air from the outside, additional moisture will be introduced, which increases the possibility of liquid water generation in the cooling system and the possibility of contact between electronic components and liquid water. In addition, due to the great latent heat of liquid water, the generation of liquid water not only does harm to electronic components, but also increases the load on the cooling system.

Therefore, how to propose a cooling system of a server that can solve the aforementioned problems is one of the problems that the industry urgently wants to invest in research and development resources to solve.

SUMMARY

In view of this, one purpose of present disclosure is to provide a cooling system of a server that can solve the aforementioned problems.

In order to achieve the above objective, according to an embodiment of the present disclosure, a cooling system of a server includes a tank and a pressure control device. The tank is configured to accommodate the dielectric fluid for dissipating heat of the server. The pressure control device is configured to adjust a pressure of the tank. The pressure control device includes a condenser, a dehumidifier, a gas storage chamber, and a valve. The condenser is connected to the tank. The dehumidifier is connected to the condenser. The gas storage chamber is connected to the dehumidifier. The valve is connected between the dehumidifier and the gas storage chamber. The valve is configured to communicate and not communicate the dehumidifier and the gas storage chamber.

In one or more embodiments of the present disclosure, the cooling system of the server further includes a barometer and a controller. The barometer is configured to detect an air pressure value in the tank. The controller is configured to make the valve not communicate the dehumidifier and the gas storage chamber when the air pressure value is greater than the upper limit value of air pressure, and is configured to make the valve communicate the dehumidifier and the gas storage chamber when the air pressure value is smaller than the upper limit value of air pressure.

In one or more embodiments of the present disclosure, the controller is further configured to make the valve not communicate the dehumidifier and the gas storage chamber when the air pressure value is smaller than the lower limit value of air pressure.

In one or more embodiments of the present disclosure, the cooling system of the server further includes a tube. An end of the tube is connected with a valve, and the valve is further configured to communicate and not communicate the dehumidifier and the tube.

In one or more embodiments of the present disclosure, the cooling system of the server further includes a barometer and a controller. The barometer is configured to detect an air pressure value in the tank. The controller is configured to make the valve not communicate the dehumidifier and the gas storage chamber and make the valve communicate the dehumidifier and the tube when the air pressure value is greater than the upper limit value of air pressure, and configured to make the valve communicate the dehumidifier and the gas storage chamber and make the valve not communicate the dehumidifier and the tube when the air pressure value is smaller than the upper limit value of air pressure.

In one or more embodiments of the present disclosure, the controller is further configured to make the valve communicate the dehumidifier and the tube and make the valve not communicate the dehumidifier and the gas storage chamber when the air pressure value is smaller than the lower limit value of air pressure.

In one or more embodiments of the present disclosure, the pressure control device further includes a case body, and the condenser, the dehumidifier, the valve, the gas storage chamber and the tube are located in the case body.

In one or more embodiments of the present disclosure, the cooling system of the server further includes a fan set. The fan set is disposed on the case body and adjacent to the condenser.

In one or more embodiments of the present disclosure, the dehumidifier further includes a cylindrical structure and a hygroscopic material. The cylindrical structure has ports on opposite sides. The hygroscopic material is disposed in the cylindrical structure and configured to absorb water instead of the dielectric fluid.

In summary, in the cooling system of the server of the present disclosure, the gas flows through the dehumidifier to increase the dehumidification efficiency and reduce the humidity of the gas in the tank. Therefore, compared with the conventional technology, the possibility of generation of condensed water can be completely reduced. In addition to avoiding the harm of liquid water to electronic components, it also avoids the additional power consumption required by the condenser to condense water vapor. In addition, the cooling system of the server of the present disclosure uses a valve to control the system air pressure within a predetermined range, so as to avoid excessive or insufficient air volume in the system. In addition, the cooling system of the server of the present disclosure uses a gas storage chamber to store the dehumidified dry air, so that the cooling system of the server maintains the dryness of the environment in the tank. In the cooling system of the server of the present disclosure, since the dehumidifier is disposed outside the tank, in addition to reducing the space required by the tank body to increase the density of the cooling system, it can also reduce the amount of the dielectric fluid usage, thus reduce the construction cost of the cooling system.

The above mentioned is only used to explain the problem to be solved by the present disclosure, the technical means to solve the problem, and the effects produced, etc. The specific details of the present disclosure will be well discussed in the following embodiments and related drawings.

BRIEF DESCRIPTION OF THE DRAWINGS

In order to make the above and other objectives, features, advantages and examples of the present disclosure more obvious, the description of the accompanying drawings is as follows.

DETAILED DESCRIPTION

Figure 2:
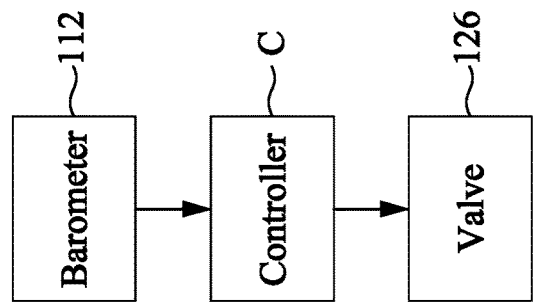
FIG. 2 shows a functional block diagram of a part of elements of the cooling system of the server as shown in FIG. 1 in accordance with an embodiment of present disclosure.

Hereinafter, a plurality of embodiments of the present disclosure will be disclosed in diagrams. For clarity of discussion, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in the cooling system 100 of the server of this embodiment and the connection relationship between the components will be described in detail.

Figure 1:
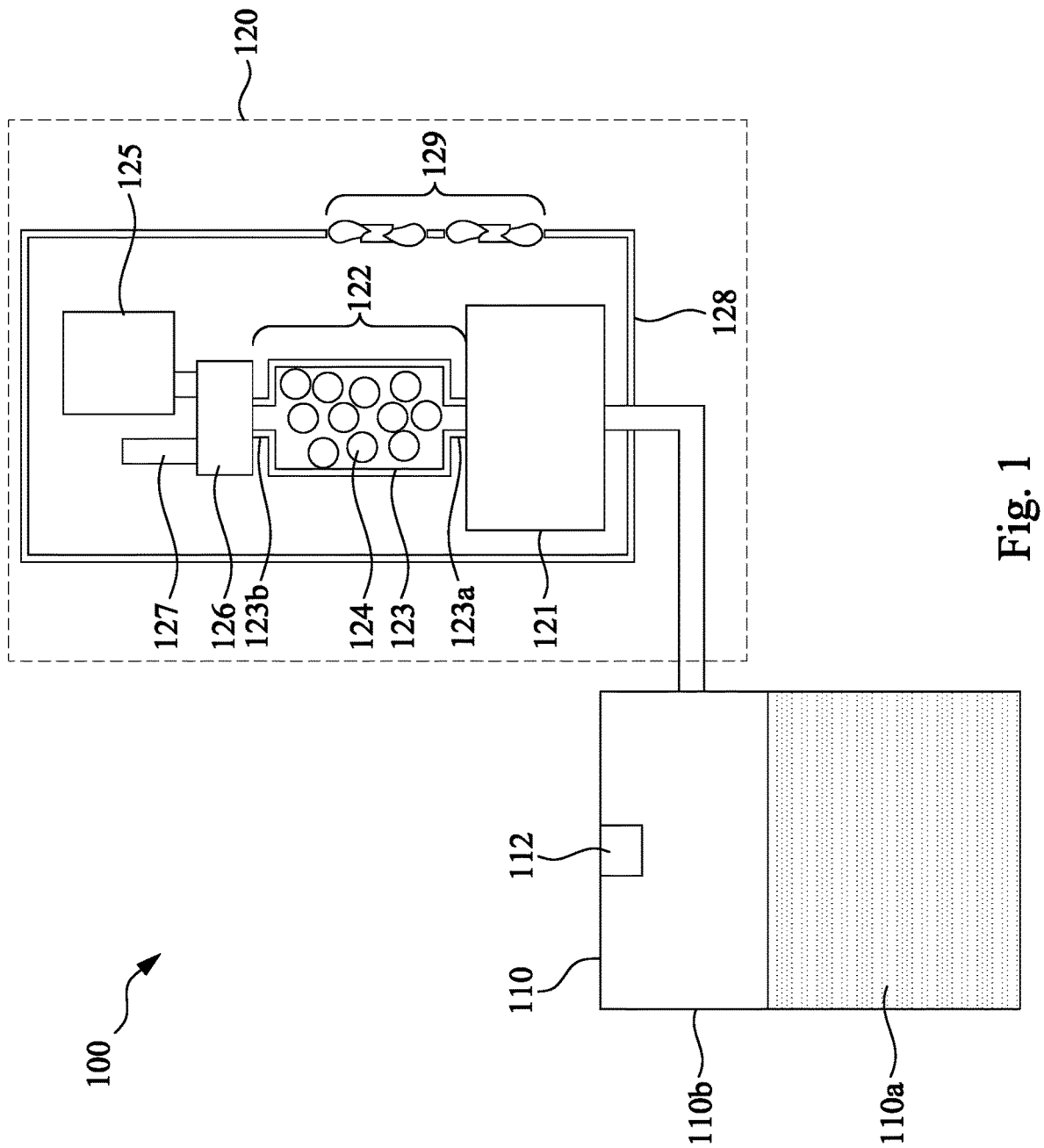
FIG. 1 shows a schematic view of a cooling system of a server in accordance with an embodiment of present disclosure.

As shown in FIG. 1, in this embodiment, the cooling system 100 of the server includes a tank 110 and a pressure control device 120. The pressure control device 120 includes a condenser 121, a dehumidifier 122, a gas storage chamber 125, and a valve 126. A side of the tank 110 is loaded with a dielectric fluid 110a, and the other side of the tank 110 is a gas side 110b opposite to the dielectric fluid 110a. The condenser 121 is connected to the tank 110. The dehumidifier 122 is connected to the condenser 121. The dehumidifier 122 includes a cylindrical structure 123 and a hygroscopic material 124. The cylindrical structure 123 has ports 123a and 123b located on opposite sides. The hygroscopic material 124 is disposed in the dehumidifier 122. The hygroscopic material 124 is configured to absorb water but not the dielectric fluid 110a. The gas storage chamber 125 is connected to the dehumidifier 122. The valve 126 is connected between the dehumidifier 122 and the gas storage chamber 125.

With the foregoing configuration, when the dielectric fluid 110a in the tank 110 generates vapor (for example, due to the heating of the electronic components), the gas in the tank 110 will reach the condenser 121 and condense the dielectric fluid 110a, then the dielectric fluid 110a flows back to the tank 110, and the remaining gas then reaches the hygroscopic material 124 and is absorbed the moisture therein. In the case that the valve 126 communicates the dehumidifier 122 and the gas storage chamber 125, the gas absorbed the moisture therein then enters the gas storage chamber 125, and the gas in the gas storage chamber 125 is dry air at this time. When the air pressure in the tank 110 drops due to a decrease in the temperature in the tank (for example, due to the electronic components stopping thermal heating), the dry air in the gas storage chamber 125 will enter the tank 110 through the hygroscopic material 124 and the condenser 121.

In some embodiments, the cooling system 100 of the server further includes a case body 128, and the condenser 121, the dehumidifier 122, the gas storage chamber 125, the valve 126, and a tube 127 are all located in the case body 128. In some embodiments, the cooling system 100 of the server further includes a fan set 129. The fan set 129 is installed on the case body 128. In some embodiments, the fan set 129 is adjacent to the condenser 121 to improve the condensation efficiency of the condenser 121. The fan set 129 may have one or more fans according to the needs of the user.

As shown in FIG. 2, in this embodiment, the cooling system 100 of the server further includes a controller C and a barometer 112. The controller C is, for example, installed outside the cooling system 100 of the server to control the valve 126. The barometer 112 is configured to measure an air pressure value in the tank 110. First, when the barometer 112 detects that the air pressure value in the tank 110 is between an upper limit value of air pressure and a lower limit value of air pressure, the controller C will control the valve 126 to communicate the dehumidifier 122 and the gas storage chamber 125 so that the dehumidified dry air will continue to enter the gas storage chamber 125. Next, when the barometer 112 detects that the air pressure value in the tank 110 is greater than the upper limit value of air pressure, the gas storage chamber 125 also reaches the upper limit of the gas volume that can be stored. At this time, the barometer 112 will send a signal to the controller C, and the controller C subsequently control the valve 126 not to communicate the dehumidifier 122 and the gas storage chamber 125 to store the dry air in the gas storage chamber 125. Subsequently, when the barometer 112 detects that the air pressure value in the tank 110 is smaller than the upper limit value of air pressure, the barometer 112 will send a signal to the controller C, and the controller C subsequently control the valve 126 to communicate the dehumidifier 122 and the gas storage chamber 125, so that the dry air stored in the gas storage chamber 125 is returned to the tank 110 through the dehumidifier 122 and the condenser 121.

As shown in FIGS. 1 and 2, in this embodiment, the cooling system 100 of the server further includes the tube 127. An end of the tube 127 is connected to the valve 126. When the barometer 112 detects that the air pressure value in the tank 110 is greater than the upper limit value of air pressure, and the gas storage chamber 125 also reaches the upper limit value of the gas volume that can be stored, at this moment, the barometer 112 will send a signal to the controller C, and the controller C subsequently control the valve 126 not to communicate the dehumidifier 122 and the gas storage chamber 125, while control the valve 126 to communicate the dehumidifier 122 and the tube 127 to allow excessive gas to escape from the tube 127 to the outside, so as to avoid excessive gas in the cooling system 100 of the server. When the barometer 112 detects that the air pressure value in the tank 110 is smaller than the upper limit value of air pressure, the barometer 112 will send a signal to the controller C, and the controller subsequently control the valve 126 to communicate the dehumidifier 122 and the gas storage chamber 125, while control the valve 126 not to communicate the dehumidifier 122 and the tube 127.

As shown in FIGS. 1 and 2, in some embodiments, when the barometer 112 detects that the air pressure value in the tank 110 is smaller than a lower limit value of air pressure, the barometer 112 will send a signal to the controller C, and the controller C subsequently control the valve 126 not to communicate the dehumidifier 122 and the gas storage chamber 125, while control the valve 126 to communicate the dehumidifier 122 and the tube 127, so as to further enable the cooling system 100 of the server to absorb air from the outside to avoid sufficient gas in the cooling system 100 of the server.

With the aforementioned structural configuration, the cooling system 100 of the server can maintain the entire system in a dry state through the moisture absorption of the hygroscopic material 124, and effectively prevent liquid water from contacting electronic components. In addition, since the vapor generated by the dielectric fluid 110a in the tank 110 can be condensed in the condenser 121 through the aforementioned path and then flow back to the tank 110, the escape of the dielectric fluid 110a can be effectively reduced to improve the recovery rate of the dielectric fluid 110a.

In some embodiments, the condenser 121 may be connected to the tank 110 through a pipe. In other embodiments, the condenser 121 may be directly connected to the tank 110.

In some embodiments, the dielectric fluid 110a may be a dielectric substance such as oil or fluorinated fluid, but the present disclosure is not limited thereto.

In some embodiments, the hygroscopic material 124 may be a molecular sieve, but the present disclosure is not limited thereto. In some embodiments, the hygroscopic material 124 can be used with a humidity indicator to facilitate the user to change the hygroscopic material 124 in real time according to the humidity state indicated by the humidity indicator.

In some embodiments, the gas storage chamber 125 may be one or more expandable and shrinkable bellows, but the present disclosure is not limited thereto.

In some embodiments, the valve 126 may be a solenoid valve, but the present disclosure is not limited thereto.

From the aforementioned detailed description of the specific embodiments of the present disclosure, it can be clearly seen that in the cooling system of the server of the present disclosure, the hot vapor in the tank caused by waste heat generated by the electronic components immersed in the dielectric fluid entering the cooling system of the server from the outside are all absorbed water vapor and/or liquid water therein through the hygroscopic material to achieve the purpose of avoiding contact between liquid water and electronic components in the cooling system of the server. Since the air entering and exiting the cooling system of the server is processed by the hygroscopic material, the cooling system of the server can be effectively maintained in a low humidity state. In the cooling system of the server of the present disclosure, the user can maintain the air pressure between the preset upper limit and lower limit and prevent the escape of the dielectric fluid through the control of the valve, so the air pressure can be effectively kept constant and increase the recovery rate of the dielectric fluid. In addition, in the cooling system of the server of the present disclosure, the elimination of the dehumidifier placed in the tank can reduce the space required by the tank, increase the system density, and can also reduce the amount of the dielectric fluid usage and reduce the construction cost of the system.

In an embodiment of the present disclosure, the cooling system of the present disclosure can be applied to a server, which can be used for artificial intelligence (AI) computing, edge computing, or used as a 5G server, cloud server or vehicle networking server.

Although the present disclosure has been disclosed as above in the embodiment manner, it is not intended to limit the present disclosure. Anyone who is skilled in the art can make various changes and modifications without departing from the spirit and scope of the present disclosure. Therefore, the scope of the present disclosure shall be subject to the scope of the attached claims.

What is claimed is:

1. A cooling system of a server, comprising:
    a tank containing a dielectric fluid for dissipating heat of the server;
    a pressure control device configured to adjust a pressure of the tank, comprising:
        a condenser connected to the tank;
        a dehumidifier connected to the condenser;
        a gas storage chamber connected to the dehumidifier; and
        a valve connected between the dehumidifier and the gas storage chamber, the valve being configured to communicate and not communicate between the dehumidifier and the gas storage chamber;
    a tube, wherein an end of the tube is connected to the valve, another end of the tube is configured to connect to the outside, and the valve is further configured to communicate and not communicate between the dehumidifier and the tube;
    a barometer configured to detect an air pressure value in the tank; and
    a controller configured to make the valve not communicate between the dehumidifier and the gas storage chamber and make the valve communicate between the dehumidifier and the tube when the air pressure value is greater than an upper limit value of air pressure, and configured to make the valve communicate between the dehumidifier and the gas storage chamber and make the valve not communicate between the dehumidifier and the tube when the air pressure value is smaller than the upper limit value of air pressure.

2. The cooling system of the server of claim 1, wherein the controller is further configured to make the valve communicate between the dehumidifier and the tube and make the valve not communicate between the dehumidifier and the gas storage chamber when the air pressure value is smaller than the lower limit value of air pressure.

3. The cooling system of the server of claim 1, wherein the pressure control device further comprises a case body, and the condenser, the dehumidifier, the valve, the gas storage chamber, and the tube are located in the case body.

4. The cooling system of the server of claim 3, further comprising a fan set disposed on the case body and adjacent to the condenser to improve condensation efficiency.

5. The cooling system of the server of claim 1, wherein the dehumidifier further comprises:
   a cylindrical structure having ports on opposite sides; and
   a hygroscopic material disposed in the cylindrical structure and configured to absorb water instead of the dielectric fluid.

* * * * *